United States Patent [19]

Ikeda et al.

[11] Patent Number: 5,034,208

[45] Date of Patent: Jul. 23, 1991

[54] PROCESS FOR PREPARING AMORPHOUS SILICON

[75] Inventors: Hiroshi Ikeda, Omiya; Makoto Tsunashima, Tokyo; Masamitsu Satoh, Shobu, all of Japan

[73] Assignee: Mitsubishi Kinzoku Kabushiki Kaisha, Tokyo, Japan

[21] Appl. No.: 456,572

[22] Filed: Dec. 29, 1989

Related U.S. Application Data

[63] Continuation of Ser. No. 106,153, Oct. 8, 1987, abandoned.

[30] Foreign Application Priority Data

| Oct. 9, 1986 | [JP] | Japan | 61-239274 |
| Mar. 11, 1987 | [JP] | Japan | 62-54198 |
| Mar. 11, 1987 | [JP] | Japan | 62-54199 |
| Mar. 11, 1987 | [JP] | Japan | 62-54200 |
| Mar. 20, 1987 | [JP] | Japan | 62-64197 |

[51] Int. Cl.$^5$ .............................. C01B 33/027
[52] U.S. Cl. .................. 423/349; 423/348; 427/255
[58] Field of Search ............ 423/348, 349, 350; 427/248.1, 255, 255.1

[56] References Cited

U.S. PATENT DOCUMENTS

| 3,974,003 | 8/1976 | Zirinsky et al. | 423/324 |
| 4,374,182 | 2/1983 | Gaul et al. | 423/349 |
| 4,696,834 | 9/1987 | Varaprath | 427/255.2 |

Primary Examiner—Olik Chaudhuri
Assistant Examiner—Ken Horton
Attorney, Agent, or Firm—Webb, Burden, Ziesenheim & Webb

[57] ABSTRACT

Amorphous silicon powder or film can be prepared by thermally decomposing a perchloropolysilane.

18 Claims, No Drawings

PROCESS FOR PREPARING AMORPHOUS SILICON

This is a continuation of copending application Ser. No. 07/106,153 filed on Oct. 8, 1987 now abandoned.

FIELD OF THE INVENTION

This invention relates to a process for preparing amorphous silicon.

Amorphous silicon powder is recently attracting attention as a material for image-forming members of electrophotographic apparatuses and a great demand therefor is expected.

Meanwhile, amorphous silicon film is very hard and is also being spotlighted as hard surface coating for various materials in recent years.

BACKGROUND OF THE INVENTION

Conventionally, amorphous silicon powder and amorphous silicon coating film are prepared by thermal decomposition of $SiH_4$, $Si_2H_6$, $Si_3H_8$, etc. However, these compounds are very unstable to oxygen, and susceptible to explosion, and thus must be handled in an inert atmosphere. These compounds must be stored in cylinders because of the high vapor pressure thereof, and are not easy to handle. Further, these materials are not necessarily inexpensive. Therefore, less reactive and more stable substances are wanted as materials for preparation of powder and coating film of amorphous silicon.

We have found that amorphous silicon can be prepared by thermal decomposition of chloropolysilanes, which are stable and free from danger of explosion.

DISCLOSURE OF THE INVENTION

This invention provides a process for preparing amorphous silicon comprising thermally decomposing perchloropolysilane $Si_nCl_{2n+2}$, wherein $n \geq 2$ at a temperature of from 250° C. to 700° C.

In one aspect of the present invention, amorphous silicon powder is prepared by thermally decomposing a perchloropolysilane per se or a perchloropolysilane diluted with an inert gas to a concentration of more than 5% by volume at a temperature of from 250° C. to 700° C.

In another aspect of the present invention, amorphous coating film is prepared by contacting a perchloropolysilane diluted with an inert gas to a concentration of not more than 5 % by volume with a substrate heated at a temperature of from 250° C. to 700° C.

In the process of the present invention, any perchloropolysilane ($Si_nCl_{2n+2}$) wherein $n \geq 2$ can be used. However, $Si_2Cl_6$, $Si_3Cl_8$ and $Si_4Cl_{10}$ are preferred. $Si_2Cl_6$ is most preferred.

Inert gases usable in the invention of the present application are noble gases, practically argon and helium.

At temperatures below 250° C., perchloropolysilanes cannot easily be decomposed. At temperatures above 700° C, the decomposition product tends to crystallize.

When a perchloropolysilane is diluted with an inert gas to a concentration of more than about 5% by volume, amorphous silicon powder is formed. Even at the concentration of more than about 2% by volume, powder may be formed, but yield is very low. When a perchloropolysilane is diluted to a concentration not more than about 5% by volume, amorphous silicon film is formed. However, good films are formed at the concentration not more than about 2% by volume.

In the process for preparing amorphous silicon powder, any heating means can be employed for effecting thermal decomposition. A perchloropolysilane gas, as is or diluted, may be blown onto a heated body. A perchloropolysilane gas may be blown into an atmosphere of a gas inert to said perchloropolysilane heated at a desired temperature. Or a heated gas inert to perchloropolysilane may be blown into a perchloropolysilane gas or liquid. A gas other than perchloropolysilane may be present during the decomposition, as long as it does not interfere with the decomposition of the perchlorosilane. Heating can be effected by means of an electric resistance heating device, laser, UV light, plasma, etc.

In the process for preparing amorphous silicon coating film, a perchloropolysilane, diluted with an inert gas to a concentration of not higher than 5% by volume, preferably to not more than 2% by volume, is blown onto a substrate body heated at a prescribed temperature.

When perchloropolysilane is decomposed, usually small amounts of decomposition byproducts such as $SiCl_4$, etc. are formed. But these byproducts are ignored in the following description.

The unreacted perchloropolysilane and the chlorine and (said decomposition byproducts) liberated by decomposition of the perchloropolysilane are usually captured by bubbling them into a 2–20% aqueous solution of sodium hydroxide.

The unreacted perchloropolysilane can be collected by trapping the gas mixture leaving the reaction zone with liquefied nitrogen and separating from the other gases by fractional distillation and recirculated for reuse thereof.

This process gives amorphous silicon coating film which is strongly adhered to the substrate. When the thickness is not more than 2,000 Å, the film is transparent and does not degrade the appearance of the substrate material. The thus formed silicon coating film is very hard, exhibiting a Vickers hardness (100 g) of 1400 or more.

Also it is chemically very stable, and is not affected by acid.

Such amorphous silicon coating films can be formed on the surface of various materials including ceramics and metals, especially glass and noble metals. For instance, bright crystal glass is soft and easily scratched and abraded. The glass can be given hard surface by forming an amorphous silicon coating thereon. Noble metals such as platinum, gold and silver are generally not so hard, and susceptible to scratching and abrasion. Although the former two are chemically stable, silver is attacked by acids, alkalis, sulfur, sulfur compounds, etc. Noble metals coated with the amorphous silicon film by the process of the present invention are provided with good resistance to mechanical abrasion and chemical attack without impairment of the appearance of noble metal per se.

A suitable thickness for the amorphous silicon coating film is 50–2,000 Å, preferably 100–1,500 Å.

DESCRIPTION OF EMBODIMENTS OF THE INVENTION

Now the invention will be illustrated by way of working examples.

EXAMPLE 1

A square quartz plate (50 mm × 50 mm) heated at 500° C. was placed in a cubic chamber made of stainless steel and having a volume of 1 m$^3$. A mixture of $Si_2Cl_6$ gas and argon (50:50 by weight) was blown onto the quartz plate at a rate of 2 g/min. for 10 hours. The formed chlorine gas and unreacted $Si_2Cl_6$ were led out and absorbed in a 5% NaOH solution. On the bottom of the chamber 50.1 g of brown powder snowed out. The powder was identified as amorphous silicon by X-ray diffraction analysis.

EXAMPLE 2

In a 2 liter reaction vessel made of Pyrex glass, 2400 g of $Si_2Cl_6$ was placed at room temperature. Into this vessel, helium gas heated to 600° C. was blown at the rate of 1 g/min. for 100 hours. The formed chlorine gas and unreacted $Si_2Cl_6$ were led out and absorbed in a 5 % NaOH solution. The formed brown powder was collected by filtration. It weighed 200 g and was identified as amorphous silicon by X-ray diffraction analysis.

EXAMPLE 3

The same reaction chamber as used in Example 1 was filled with argon and kept at 500° C. A 50:50 mixture (volume) of $Si_2Cl_6$ and argon was blown into the vessel at the rate of 2 g/min. for 10 hours. The formed chlorine and unreacted $Si_2Cl_6$ were collected in an alkali solution. On the bottom of the reaction chamber, 55.7 g of brown powder snowed out. The powder was identified as amorphous silicon by X-ray diffraction analysis. Examples 4-6, Comparative Examples 1-2

The procedure of Example 1 was repeated at various decomposition temperatures. The results are shown in Table 1.

TABLE 1

|  | Decomp. Temp. | Yield of Amorphous Silicon |
| --- | --- | --- |
| Comp. Ex. 1 | 200° C. | 0 g |
| Ex. 4 | 250° C. | 45.6 g |
| Ex. 5 | 400° C. | 52.3 g |
| Ex. 6 | 700° C. | 48.7 g |
| Comp. Ex. 2 | 750° C. | 0 g |

EXAMPLES 7-9, COMPARATIVE EXAMPLE 3

The procedure of Example 1 was repeated with the $Si_2Cl_6$/argon ratio varied. The results are shown in Table 2.

TABLE 2

|  | Conc. of $Si_2Cl_6$ (% by vol.) | Yield of Amorphous Silicon (g) |
| --- | --- | --- |
| Ex. 7 | 100 | 105 |
| Ex. 8 | 20 | 66 |
| Ex. 9 | 2.5 | 15 |
| Comp. Ex. 3 | 2.0 | Polycrystalline silicon film was formed |

EXAMPLE 10

The procedure of Example 1 was repeated using $Si_3Cl_8$, and 74.3 g of brown powder was obtained. The powder was identified as amorphous silicon by X-ray diffraction analysis.

EXAMPLE 11

The procedure of Example 1 was repeated using $Si_4Cl_{10}$, and 97.8 g of brown powder was obtained. The powder was identified as amorphous silicon by X-ray diffraction analysis.

EXAMPLE 12

In the same reaction chamber as used in Example 1, a 30 cm × 30 cm glass plate was placed and heated to 400° C. with an electric resistance heater from the back. A mixed stream of $Si_2Cl_6$ (0.02 g/min.) and argon (100 ml/min.) was blown onto the glass for 40 hours. The mixture of the formed chlorine and the unreacted $Si_2Cl_6$ was trapped in liquefied nitrogen and $Si_2Cl_6$ was recovered by fractional distillation. The $Si_2Cl_6$ recovered was recirculated and reused. Thus a 1000 Å thick transparent silicon film was formed on the surface of the glass plate. The film was identified as amorphous by Raman spectroscopic analysis.

The thus coated glass plate was transparent, and the silicon layer thereof exhibited a Vickers hardness (100 g) of 1490. When it was immersed in a 6N HCl solution at 80° C. for 100 hours, no change developed in the surface. It was proved that the silicon coating film is effective as a protective coating.

COMPARATIVE EXAMPLE 4

The procedure of Example 12 was repeated with heating at 200° C. No silicon film was formed.

COMPARATIVE EXAMPLE 5

The procedure of Example 12 was repeated with heating at 800° C. Although a silicon film was formed, the formed film was not transparent. Raman spectroscopic analysis revealed that the film was polycrystalline.

EXAMPLE 13

The procedure of Example 12 was repeated with a glass plate heated at 250° C. An amorphous silicon film was formed, and the film exhibited a Vickers hardness (50 g) of 1420. In the same test as in Example 12, the film was not attacked by acid.

EXAMPLE 14

The procedure of Example 12 was repeated with a glass plate heated at 700° C. An amorphous silicon film was formed, and the film exhibited a Vickers hardness (200 g) of 1430. In the same test, the film was not attacked by acid.

EXAMPLE 15

A reaction tube was prepared by winding an electric resistance wire round a quartz tube, the inner diameter of which is about 5.5 cm, and protecting the outside with asbestos. A 1 mm thick 3 cm square gold plate was placed in the reaction tube electrically heated at 300 ° C. A mixed stream of $Si_2Cl_6$ (0.02 g/min.) and argon (100 ml/min.) was passed through the reaction tube. An amorphous silicon film was formed. The thus treated gold plate had the same appearance as neat gold. However, the silicon film thereof had a Vickers hardness (10 g) of 1415. In the same test, the silicon film was not affected by acid.

EXAMPLE 16

A 2 mm thick 5 cm square silver plate was placed in the same reaction tube as used in Example 15, which was heated at 300° C. An amorphous silicon film was formed in the same manner as in Example 15. The thus treated silver plate had the same appearance as neat silver. However, the silicon film thereof had a Vickers hardness (50 g) of 1421. In the same test, the silicon film was not affected by acid, although the exposed silver portion was attacked by nitric acid.

EXAMPLE 17

A 3 mm thick 3 cm square aluminum plate the surface of which had been anodized was placed in the same reaction tube as used in Example 15, which was heated at 400° C. An amorphous silicon film was formed in the same manner as in Example 15. The obtained silicon film had a Vickers hardness (100 g) of 1418. In the same test, the film was not affected.

EXAMPLE 18

A tin vase of a complicated shape was heated at 300° C., and treated in the same manner as in Example 1. All the parts of the tin vase—including the inside of the engravings—were well coated with silicon film, and were well protected from attack of acid.

EXAMPLE 19

A 50 cm×50 cm mild steel plate having a thickness of 4 mm was heated at 300° C. by an electric resistance heater placed in the same chamber as used in Example 12, and silicon film was formed in the same manner in Example 12. The thus treated steel plate had the same appearance as that of mild steel, but the silicon film had a Vickers hardness (50 g) of 1490. In the same test, the silicon film was not affected, although the exposed iron portion was dissolved.

EXAMPLES 20-22, COMPARATIVE EXAMPLE 4

The procedure of Example 12 was repeated with the concentration of $Si_2Cl_6$ varied. The results are shown in Table 3.

TABLE 3

| | Conc. % | Results |
|---|---|---|
| Comp. Ex. 4 | 5.5 | No film was formed |
| Ex. 20 | 4.5 | Film*1 was formed |
| Ex. 21 | 2 | Good film*2 was formed |
| Ex. 22 | 1 | Good film was formed |

*1Film means: Homogeneous film strongly adhered to substrate not accompanied by powder
*2Good film means: Homogeneous film strongly adhered to substrate not accompanied by powder and substantially free from pinholes

EXAMPLE 23

In the same reaction chamber as used in Example 1, a 5 cm×5 cm gold plate was placed and heated at 400° C. by means of an electric resistance heater, and $Si_2Cl_6$ (0.02 g/min.) and argon (100 ml/min.) were blown in. The formed chlorine and unreacted $Si_2Cl_6$ were trapped with liquid nitrogen, the $Si_2Cl_6$ was collected by fractional distillation and recirculated and reused. Thus an 800 Å thick transparent silicon film was formed on the surface of the gold plate. It was confirmed by Raman spectroscopy that the silicon film was amorphous. The thus treated gold plate retained the brightness of gold, and the silicon layer exhibited a Vickers hardness (50 g) of 1400. The silicon film underwent no change when soaked in a 6N HCl solution at 80° C. for 100 hours, and suffered no scratches when rubbed with a piece of unglazed porcelain. A gold plate without the silicon coating was scratched with unglazed porcelain.

EXAMPLE 24

The procedure of Example 23 was repeated using a silver plate of the same size, and an 800 Å thick silicon film was formed on the surface. The thus treated silver plate retained the brightness of silver per se and was not affected with acid. Also it did not lose brightness when exposed to hydrogen sulfide. The Vickers hardness (100 g) of the silicon layer was 1420, and the silicon film remained sound even after it was subjected to buffing for 24 hours.

EXAMPLE 25

The procedure of Example 23 was repeated using a 0.5 mm thick 2 cm×5 mm platinum plate. An amorphous silicon film was formed, the Vickers hardness (100 g) of which was 1420.

EXAMPLE 26

In the same reaction chamber as used in Example 1, a 30 cm×30 cm glass was placed and heated at 400° C. by an electric resistance heater. $Si_2H_6$ (0.02 g/min.) and argon (100 ml/min.) was blown in for 40 hours. The formed chlorine and unreacted $Si_2Cl_6$ were absorbed in an alkaline solution. Thus a 2000 Å thick transparent silicon film was formed on the surface of the glass. It was confirmed by Raman spectroscopy that the formed silicon film is amorphous. The silicon layer exhibited a Vickers hardness (200 g) of 1350. The coated glass plate did not suffer scratching when rubbed with a piece of unglazed porcelain. The glass was not attacked by diluted acid, and underwent no change when exposed to hydrogen fluoride vapor.

EXAMPLE 27

A crystal cutglass vase was placed in the same reaction chamber as used in Example 1, the procedure of Example 12 was repeated, and an 800 Å thick silicon coating film was formed. The thus treated crystal glass retained the original brightness. The ground portions also retained original appearance.

We claim:

1. A process for preparing amorphous silicon comprising essentially of thermally decomposing gaseous perchloropolysilane $Si_nCl_{2n+2}$, wherein $n \geq 2$ at a temperature of from 250° C. to 700° C.

2. The process for preparing amorphous silicon as set forth in claim 1, wherein the perchloropolysilane is $Si_2Cl_6$, $Si_3Cl_8$ or $Si_4Cl_{10}$.

3. The process for preparing amorphous silicon as set forth in claim 2, where the perchloropolysilane is $Si_2Cl_6$.

4. The process for preparing amorphous silicon as set forth in claim 1, wherein amorphous silicon powder is formed by diluting the perchloropolysilane with an inert gas to a concentration more than 5% by volume.

5. The process for preparing amorphous silicon as set forth in claim 4, wherein the perchloropolysilane is $Si_2Cl_6$, $Si_3Cl_8$ or $Si_4Cl_{10}$.

6. The process for preparing amorphous silicon as set forth in claim 5, wherein the perchloropolysilane is $Si_2Cl_6$.

7. The process for preparing amorphous silicon as set forth in claim 4, wherein the inert gas is helium or argon.

8. The process for preparing amorphous silicon as set forth in claim 7, wherein the inert gas is argon.

9. The process for preparing amorphous silicon as set forth in claim 1, wherein amorphous silicon film is formed by diluting the perchloropolysilane with an inert gas to a concentration of not more than 5% by volume.

10. The process for preparing amorphous silicon as set forth in claim 9, wherein the perchloropolysilane is diluted to a concentration of not more than 2% by volume.

11. The process for preparing amorphous silicon as set forth in claim 9, wherein the perchloropolysilane is $Si_2Cl_6$, $Si_3Cl_8$ and $Si_4Cl_{10}$.

12. The process for preparing amorphous silicon as set forth in claim 11, wherein the perchloropolysilane is $Si_2Cl_6$.

13. The process for preparing amorphous silicon as set forth in claim 9, wherein the inert gas is helium or argon.

14. The process for preparing amorphous silicon as set forth in claim 13, wherein the inert gas is argon.

15. A process for preparing amorphous silicon comprising essentially of thermally decomposing gaseous perchloropolysilane $Si_nCl_{2n+2}$, wherein $n \geq 2$ at a temperature of from 250° C. to less than 550° C.

16. The process for preparing amorphous silicon as set forth in claim 15 wherein said perchloropolysilane is $Si_2Cl_6$, $Si_3Cl_8$, and $Si_4Cl_{10}$.

17. A process for preparing amorphous silicon comprising essentially of thermally decomposing gaseous perchloropolysilane $Si_ncl_{2n+2}$, wherein $n \geq 2$ at a temperature of from 250° C. to 399° C.

18. The process for preparing amorphous silicon as set forth in claim 17 wherein said perchloropolysilane is $SiCl_6$, $SiCl_8$ or $Si_4Cl_{10}$.

* * * * *